United States Patent [19]

Kirch et al.

[11] Patent Number: 4,923,772

[45] Date of Patent: May 8, 1990

[54] HIGH ENERGY LASER MASK AND METHOD OF MAKING SAME

[76] Inventors: Steven J. Kirch, 344 Beaver Rd., Lagrangeville, N.Y. 12540; John R. Lankard, Archer Rd., R.D. 4, Box 7, Mahopac, N.Y. 10541; John J. Ritsko, 70 High Ridge Rd., Mt. Kisco, N.Y. 10549; Kurt A. Smith, 6 Silver La., Poughkeepsie, N.Y. 12602; James L. Speidell, 1527 Weber Hill Rd., Carmel, N.Y. 10512; James T. Yeh, Veronica Pl., R.D. 2, Katonah, N.Y. 10536

[21] Appl. No.: 341,273

[22] Filed: Apr. 17, 1989

Related U.S. Application Data

[63] Continuation of Ser. No. 924,480, Oct. 29, 1986, abandoned.

[51] Int. Cl.$^5$ ................................................. G03F 1/00
[52] U.S. Cl. ........................................ 430/5; 430/323; 430/324; 430/945; 378/35; 156/626
[58] Field of Search ............... 430/5, 30, 321, 324, 430/326, 329, 296, 945, 967, 323; 378/35; 156/626

[56] References Cited

U.S. PATENT DOCUMENTS

| 4,440,841 | 4/1984 | Tabuchi | 430/5 |
|---|---|---|---|
| 4,447,905 | 5/1984 | Dixon et al. | 372/46 |
| 4,478,677 | 10/1984 | Chen et al. | 156/635 |
| 4,490,210 | 12/1984 | Chen et al. | 156/643 |
| 4,490,211 | 12/1985 | Chen et al. | 156/643 |
| 4,514,896 | 5/1985 | Dixon et al. | 29/576 B |
| 4,522,862 | 6/1985 | Bayer et al. | 428/195 |

FOREIGN PATENT DOCUMENTS 0081055 10/1982 European Pat. Off. .
0279670 2/1988 European Pat. Off. .

OTHER PUBLICATIONS

IBM Technical Disclosure Bulletin, vol. 13, No. 1, Jun. 1970, p. 158, New York, U.S.; W. M. Moreau et al.: "Dielectric Photomasks".

Research Disclosure, No. 258-25856, Oct. 1985, anonymous, "Damage Resistant Metal Projection Masks for High Intensity UV Radiation".

Primary Examiner—Jose Dees

[57] ABSTRACT

The present invention is a mask and methods for making masks for use with a laser projection etching system. The unique mask is able to withstand the fluences of the high energy and high power lasers used without degrading. Specifically, the new projection etching masks are fabricated of patterned multiple dielectric layers having alternating high and low indices of refraction on a UV grade synthetic fused silica substrate in order to achieve maximum reflectivity of the laser energy in the opaque areas and maximum transmissivity of the laser energy in the transparent areas of the mask.

8 Claims, No Drawings

HIGH ENERGY LASER MASK AND METHOD OF MAKING SAME

This application is a continuation, of application Ser. No. 924,480, filed 10/29/86 now abandoned.

The invention relates to non-contact masks of the type used for projection etching with electromagnetic energy sources. More particularly, non-contact masks, which are not only opaque to but totally reflective of the laser energy in the non-patterned areas, and methods for making such masks are taught.

BACKGROUND OF THE INVENTION

In the field of microelectronic materials processing, there is a need to selectively deposit and etch metal films, glass and layers of other materials such as polymers. Projection etching using lasers directed through non-contact masks onto the targets have been developed in response to the need to deposit and etch efficiently without excessive exposure of the target to photolithographic contact masks, photoresists and/or patterned transfer layers, and the various processing and cleaning solutions involved in standard contact mask processing. In addition, the distance between the mask/optical system and the target reduces the potential for contamination of the mask/optical system by the resultant etch products.

As disclosed in several patents of Chen, et al, specifically U.S. Pat. Nos. 4,490,210, 4,490,211 and 4,478,677, all assigned to the present assignee and incorporated by reference herein, the laser energy may be directed through a mask which is adjacent to the target material such that it falls directly onto the target, in much the same way as the photolithographic lift-off masks which are well known in the art; or, the mask can be situated between the laser and a projector arrangement wherein the patterned laser image emerging from the mask is processed by the projector (for example: reduced) and directed onto the target. The target substrate may be mounted in air or, more frequently, is mounted in a chamber which is to be evacuated and subsequently filled with an ambient. The ambient is selected to react with the material on the surface of the target to create a product which will volatize when irradiated by the laser energy. Since the laser beam has been patterned, only that ambient-surface material compound in the path of the transparent areas of the mask, and consequently in the path of the laser energy, will be volatized and therefore etched. Many materials can be etched "directly" by the laser energy such that they will volatize in air or in a vacuum without the need for an intermediate step of creating a volatizable ambient-material compound. The lasers used are ordinarily high power and high energy, with an energy density, or fluence, in the range of several hundred millijoules per centimeter squared.

The Chen, et al patents describe the non-contact masks used as being ". . . of a conventional type having a transparent body upon which an opaque pattern is formed[.] [t]he opaque pattern corresponding to the areas of the substrate not to be etched." (See U.S. Pat. No. 4,478,677 at Column 9, lines 18-21 and U.S. Pat. No. 4,490,210 at Column 5, lines 53-56). The mask material is further discussed in U.S. Pat. No. 4,490,211 as having a transparent substrate/body of UV grade quartz with a patterned chromium film thereon. It has been found, however, that the standard chromium masks cannot withstand laser fluences of the order encountered when working with excimer or other lasers having the necessary intensity to etch the target materials. Although opaque to UV light and fairly reflective at visible wavelengths, in addition to being durable and easy to pattern, chromium absorbs approximately 35% of the light at 308 nm and 46% at 248 nm. Therefore, a single excimer laser pulse can easily ablate the chromium and destroy the pattern. Discussions of laser-induced damage can be found in the proceedings of the annual conference on laser damage, "Laser Induced Damage in Optical Materials", 1979-NBS Special Publication 568, Library of Congress Catalog Card No. 80-600110.(Subsequent conference proceedings can also be located at that repository.)

It is therefore an objective of the present invention to provide a mask material suitable for use with high energy, high power lasers in projection etching arrangements.

It is another objective of the present invention to provide a method for making such suitable masks.

It is a further objective of the invention to fabricate a mask having areas transparent to the laser to allow passage without significant loss in intensity and opaque areas capable of reflecting the laser energy without degrading the reflective material in those opaque areas.

SUMMARY OF THE INVENTION

These objectives will be attained by the present invention in which a specially selected laser-reflective mirror is patterned using any one of the methods disclosed herein. The mask itself is comprised of a transparent substrate having a patterned laser-reflective metal or dielectric coating deposited thereon. Patterning of a highly reflective metal may be done in accordance with standard mask fabrication techniques with some modifications to enhance the durability and laser compatibility of the mask. Furthermore, the patterning of dielectric coatings, of the type able to withstand the laser intensity demands for projection etching, requires a unique series of processing steps. Lift-off mask techniques and patterning by ion-milling are the primary means of providing a patterned mask for the stated purposes.

DETAILED DESCRIPTION OF THE INVENTION

In response to the need to etch a variety of materials in the microprocessing arena, the technique of laser projection etching was developed. As discussed in the Chen, et al patents, U.S. Pat. Nos. 4,490,210; 4,490,211 and 4,478,677 assigned to the present assignee, the laser energy is directed through a separate, re-usable mask to fall directly on the target substrate or to be processed (e.g. reduced) through a projector arrangement and subsequently directed onto the target. As noted therein, the laser intensities needed are of the order of 300 mJ/cm2. Certain wavelengths of laser light are used more frequently in the etching of familiar semiconductive materials. As an example, a 248 nm wavelength laser will etch silicon in a fluorine ambient. Reference will be made throughout to various features of the masks using the 248 nm wavelength by means of example. No feature of the invention is limited to use with a particular laser wavelength or intensity unless specifically noted.

The masks discussed in the Chen, et al patents are ". . . of a conventional type having a transparent body with an opaque pattern formed thereon." The conventional masks used in the semiconductor industry are chromium patterns deposited on a glass substrate. Chromium is widely used in the microelectronic industry as a mask material for low level light projection printing because it is a fair reflector and is opaque, resistant to abrasions and easily patterned. The damage threshold for a chromium mask, however, was found to be quite low. At 248 nm, a sample having 1000 angstroms of patterned chromium deposited on a UV grade synthetic fused silica substrate exhibited a damage threshold of 0.115J/cm2 when illuminated from the quartz side and 0.100J/cm2 on the metal side. Since chromium absorbs 46% of the laser energy at 248 nm, as noted above, a single pulse from the excimer laser operating at 200 mJ/cm2 can evaporate finely patterned chromium and destroy the mask.

Absorption of the laser energy by the mask material is the cause of the degradation and eventual destruction of the mask patterns. The absorption problem has been encountered continually in the laser technology prompting the use of non-absorbing materials. In response to the need for reflectors for directing and focusing laser beams, mirrors having highly reflective metal coatings with perfectly planar, inclusion-free surfaces have been developed. The presence of ad therefore the processing of these mirrors is critical.

Aluminum can be used as an excimer laser mask material if the energy density requirements are in the range of less than 200 mJ/cm2. Aluminum is an excellent reflector in the ultraviolet, approximately 92% reflection at 248 nm. Aluminum is, however, quite soft and easily damaged giving rise to abrasions which are susceptible to laser damage. In addition, aluminum oxidizes rapidly when the metal film comes into contact with oxygen, forming a metal oxide which has a greatly reduced reflectivity. A protective coating is used on aluminum mirrors to avoid these problems. A half-wavelength of magnesium fluoride (MgF2), for example, evaporated on the exposed metal surface will provide improved abrasion resistance without compromising the reflectivity. A MgF2 coated aluminum mirror can still reflect 88% of the incident light at 248 nm. In preparing an aluminum mask, the cleanliness of the vacuum system, the preparation of the substrate and the purity of the metal are some of the factors which can affect the absorption of the mirror. Any impurity, air or other foreign matter will lower the reflectivity of the aluminum thereby increasing the absorbance and lowering the damage threshold. The aluminum masks are formed on UV grade synthetic fused silica substrates by one of several methods. The first method involves depositing the aluminum in a vacuum by e-beam evaporation, or other known evaporation method. Without exposure of the aluminum to any oxygen-containing environment, the aluminum is patterned by ion-milling. Ion milling is preferred to a wet etching process wherein it would be necessary to expose the aluminum to chemicals which may oxidize the aluminum thereby changing the absorption and the damage threshold. Furthermore, clean vertical surfaces can be obtained by ion milling as opposed to the tapered walls which result from a wet-etching process. A protective coating of MgF2, SiO2 or other dielectric may then be deposited on the aluminum patterned synthetic fused silica substrate. The protective layer can be deposited prior to the pattern formation; however, the etching step would then leave bare oxidizable aluminum on the vertical surfaces, necessitating an additional deposition of MgF2 or other dielectric to coat the exposed aluminum along with subsequent directional etching to remove the MgF2 coating from the substrate.

A second approach to the mask patterning would be to deposit the aluminum through a lift-off mask in accordance with known techniques. Again, the protective coating could be deposited before or after the lift-off step. If SiO2 is used as the protective coating, the preferred mode would be to deposit a layer of SiO2 after the patterning is completed. The SiO2 layer thickness should be at least equal to the thickness of the deposited aluminum to insure coverage on the vertical surfaces and edges. The SiO2 coating could remain and not significantly alter the transmissive quality of the underlying transparent synthetic fused silica. In the alternative, as above, standard sidewall processing could be employed to deposit and directionally etch the protective coating, thereby ensuring coverage by the MgF2 or SiO2 or other appropriate coating on the vertical surfaces and edges of the aluminum.

As noted above, a patterned aluminum-on-silica mask has high reflectivity but cannot withstand the very high laser fluences. At 248 nm, the damage threshold of a patterned aluminum-on-synthetic fused silica sample was 200 mJ/cm2 when irradiated from the silica side. The damage threshold for metal films is higher at the metal substrate interface. Therefore, the aluminum mask cannot withstand the full range of laser intensities encountered in projection etching. In the alternative, and in the ranges of fluences greater than 100 mJ/cm2, the preferred mask material is a highly reflective, abrasion-resistant dielectric coating. Reflection from dielectric coatings is obtained by virtue of the interference effects between abutting layers of materials having differing indices of refraction. As taught in the literature, if the index of refraction of a quarter wavelength of film is higher than that of the underlying layer, a substantial amount of light incident on that interface will be reflected. Each pair of dielectric layers will reflect a given amount of the incident light; and, by depositing many layers, greater than 99.9% reflectivity may be obtained. The number of layers is dependent on the intended usage. For an excimer laser, at 248 nm, a 99% reflectivity can be achieved with fewer than 30 layers of dielectric. The high index material may be hafnium oxide, scandium oxide, aluminum oxide or thallium fluoride. Low index of refraction materials include silicon dioxide, magnesium fluoride and cryolite (Na3AlF6). These materials are cited as examples and the lists are not intended to be exhaustive. Other materials are contemplated. The particular materials listed exhibit not only the desirable indices of refraction but are also impervious to damage by water, acetone, alcohol, detergents and most acids and bases making them ideal candidates for photo-lithographic patterning. The high index materials are generally hard surfaces which are abrasion-resistant. The top layer of the stack, therefore, would preferably be a quarter wave-length of the hard, high index material as a protective layer.

The patterning of a blanket-deposited dielectric coating can be done by ion-milling through a mask pattern Plasma or reactive ion etching is somewhat slower and more difficult with the dielectric coatings since the high index materials tend to be non-reactive. As an example, a substrate, preferably of UV grade synthetic fused silica is coated with alternating layers of the low and high index materials, such as hafnium oxide and silicon dioxide. A photosensitive masking material is then deposited on the surface of the top layer of high index material, exposed and removed in the areas in which the dielectric is to be removed. The exposed dielectric coatings are then subjected to an ion milling step to remove the dielectric materials and expose the underlying transparent substrate. In order to determine when to stop the ion milling, several etch stop schemes have been utilized. A first method of determining the point at which all dielectric layers have been removed would be to interrupt the etching process to measure the depth of the etched area to determine if all of the thicknesses of dielectric layer have been removed. Such an "etch stop" process is rather time consuming and somewhat ineffective, leading to problems of underetching and overetching. In the alternative, a method has been devised utilizing Brewster's angle, that angle at which all of the incident light, of a particular polarization, which is directed onto the dielectric will pass into the dielectric substrate material. Brewster's law states that the index of refraction for a material is equal to the tangent of the polarizing angle for the material. By polarizing the beam so that the plane of polarization is parallel to the plane formed by the incident beam and the reflected beam (i.e. p-polarization) and choosing the angle of incidence, the incident beam will be reflected by the dielectric layers but will pass into the substrate. As an example, quartz has an index of refraction of 1.457018 and aluminum oxide has an index of refraction of 1.76556 at the wavelength of a HeNe beam (6328 angstroms). The respective Brewster's angles are 55.5 degrees and 60.5 degrees. Utilizing an angle of incidence of 55.5 degrees for a HcNe beam which has been p-polarized, one can detect a reflected ray from the surface of the aluminum oxide but the value of reflected light drops off to zero when the beam is incident on the surface of the quartz substrate. Therefore, by monitoring the reflected beam, one can determine when the last layer of dielectric has been etched and, therefore, when to stop the ion milling process.

As discussed with regard to the patterning of aluminum on synthetic fused silica, an alternative to patterning the blanket dielectric coatings is the deposition of the dielectric layers through a lift-off mask. A relatively pure substrate material such as UV grade synthetic fused silica is preferred for all mask preparation, as above, to avoid laser absorption by impurities or inclusions in a less pure material such as fused quartz. In selecting a substrate material, certain properties are sought such as purity, freedom from bubbles and inclusions, OH content, fluorescence, homogeneity, high radiation resistance, high optical transmissivity and compatible refractive index. In accordance with the teachings above, with reference to the stacking of quarter wavelength layers alternating between high and low index materials, the patterned dielectric mask can be formed through the lift-off mask by deposition of the alternating materials.

The fluence withstood by the patterned dielectric coated masks is of the order of 6J/cm2 rendering it ideal for the laser projection purposes. It is apparent that the masks fabricated in accordance with the teachings herein will be useful for deposition and etching by means other than laser projection. Being durable and largely impervious to chemical damage, the dielectric-coated masks can be utilized in a variety of arenas. Furthermore, the composition and arrangement of the dielectric layers may be chosen to provide a desired level of reflectivity and chemical stability for the intended purposes. As noted above, the teachings of the invention are not limited to the particular materials or processing steps described but are intended to encompass a full range of equivalents.

What is claimed is:

1. A method for making a mask, for use with high energy radiation sources, on a substrate comprising the steps of:
    applying a lift-off patterned mask to the substrate
    applying a plurality of layers of dielectric, each layer comprising a coating of a first material and a coating of a second material overlying said first material, the index of refraction of said second material being higher than the index of refraction of said first material and
    removing the lift-off mask and dielectric material deposited thereon.

2. The method of claim 1 wherein the substrate is comprised of UV grade synthetic fused silica.

3. The method of claim 1, wherein said first material is selected from the group consisting of silicon dioxide, magnesium fluoride and cryolite, and said second material is selected from the group consisting of hafnium oxide, scandium oxide, aluminum oxide and thallium fluoride.

4. A method for making a mask, for use with high energy radiation sources, on a substrate comprising the steps of;
    applying a layer of radiation-sensitive matter to the substrate;
    selectively irradiating said matter;
    removing the irradiated matter to reveal the underlying substrate;
    applying plurality of layers of dielectric, each layer comprising a coating of a first material and a coating of a second material overlying said first material, the index of refraction of said first material;
    and removing the lift-off mask and dielectric material disposed thereon.

5. The method of claim 4 wherein said radiation-sensitive matter is photosensitive matter and wherein said irradiating step comprises exposing said matter to ultraviolet radiation.

6. A method for producing masks able to withstand high energy radiation comprising the steps of:
    providing a substrate transparent to said radiation;
    applying a plurality of layers of dielectric to said substrate, each layer comprising a coating of a first material and a coating of a second material overlying said first material, said second material having an index of refraction greater than the index of defraction of said first material;
    applying a mask pattern having patterned and non-patterned areas to the substrate;
    removing said plurality of layers of dielectric in the non-patterned areas by ion milling; and removing said mask pattern.

7. The method of claim 6, further comprising the steps of:
    applying a light beam incident to the surface of said plurality of layers at an angle whose tangent is equal to the index of refraction of said substrate;
    polarizing said light beam such that the beam will be reflected at the interface between said first and second materials but will pass into said substrate;
    monitoring the reflected beam; and halting the removing step when said incident beam is no longer reflected.

8. The method of claim 6 wherein said first material is selected from the group consisting of silicon dioxide, magnesium fluoride and cryolite and the second material is selected from the group consisting of hafnium oxide, scandium oxide, aluminum oxide and thallium fluoride.

* * * * *